(12) United States Patent
Swoboda

(10) Patent No.: US 9,523,738 B2
(45) Date of Patent: Dec. 20, 2016

(54) TCK/TMS(C) COUNTER CIRCUITRY WITH THIRD, FOURTH COUNT AND RESET OUTPUTS

(71) Applicant: TEXAS INSTRUMENTS INCORPORATED, Dallas, TX (US)

(72) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/990,456

(22) Filed: Jan. 7, 2016

(65) Prior Publication Data
US 2016/0116535 A1     Apr. 28, 2016

Related U.S. Application Data

(62) Division of application No. 14/803,645, filed on Jul. 20, 2015, now Pat. No. 9,267,990, which is a division of application No. 14/504,665, filed on Oct. 2, 2014, now Pat. No. 9,116,207, which is a division of application No. 13/964,574, filed on Aug. 12, 2013, now Pat. No. 8,880,926, which is a division of application No. 12/511,973, filed on Jul. 29, 2009, now abandoned.

(60) Provisional application No. 61/084,474, filed on Jul. 29, 2008, provisional application No. 61/084,471, filed on Jul. 29, 2008, provisional application No. 61/084,463, filed on Jul. 29, 2008, provisional application No. 61/084,458, filed on Jul. 29, 2008, provisional application No. 61/084,453, filed on Jul. 29, 2008, provisional application No. 61/084,439, filed on Jul. 29, 2008.

(51) Int. Cl.
| | |
|---|---|
| *G06F 1/00* | (2006.01) |
| *G06F 1/04* | (2006.01) |
| *G01R 31/3177* | (2006.01) |
| *G01R 31/3185* | (2006.01) |
| *G06F 11/22* | (2006.01) |
| *G01R 31/317* | (2006.01) |
| *G06F 11/36* | (2006.01) |
| *G06F 11/27* | (2006.01) |
| *G06F 11/267* | (2006.01) |
| *H04L 12/26* | (2006.01) |

(52) U.S. Cl.
CPC ..... *G01R 31/3177* (2013.01); *G01R 31/31727* (2013.01); *G01R 31/318533* (2013.01); *G01R 31/318538* (2013.01); *G01R 31/318544* (2013.01); *G06F 11/22* (2013.01); *G06F 11/267* (2013.01); *G06F 11/27* (2013.01); *G06F 11/36* (2013.01); *G06F 11/3656* (2013.01); *G06F 2201/88* (2013.01); *H04L 12/2697* (2013.01); *H04L 43/50* (2013.01)

(58) Field of Classification Search
CPC .... G06F 11/267; G06F 11/36; G06F 2201/88; G06F 11/27; H04L 12/2697
USPC ................. 713/400, 500, 502; 702/117, 120
See application file for complete search history.

(56) References Cited

U.S. PATENT DOCUMENTS 8,880,926 B2 * 11/2014 Swoboda ......... G01R 31/31853
702/117

\* cited by examiner

*Primary Examiner* — Michael J Brown
(74) *Attorney, Agent, or Firm* — Lawrence J. Bassuk; Charles A. Brill; Frank D. Cimino

(57) ABSTRACT

Control events may be signaled to a target system having a plurality of components coupled to a scan path by using the clock and data signals of the scan path. While the clock signal is held a high logic level, two or more edge transitions are detected on the data signal. The number of edge transitions on the data signal is counted while the clock signal is held at the high logic state. A control event is determined based on the counted number of edge transitions on the data signal after the clock signal transitions to the low logic state.

3 Claims, 9 Drawing Sheets

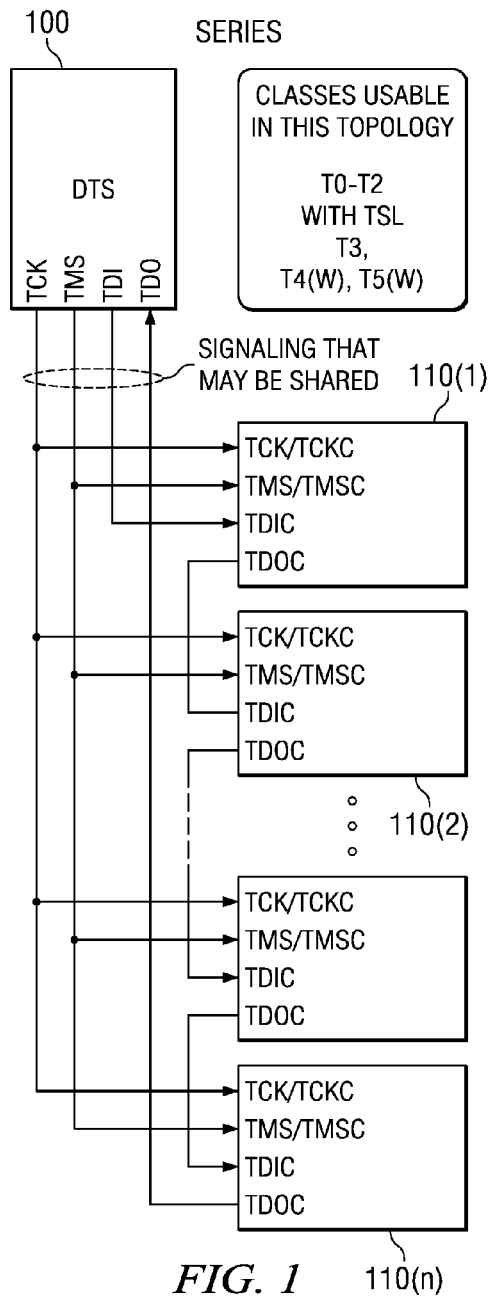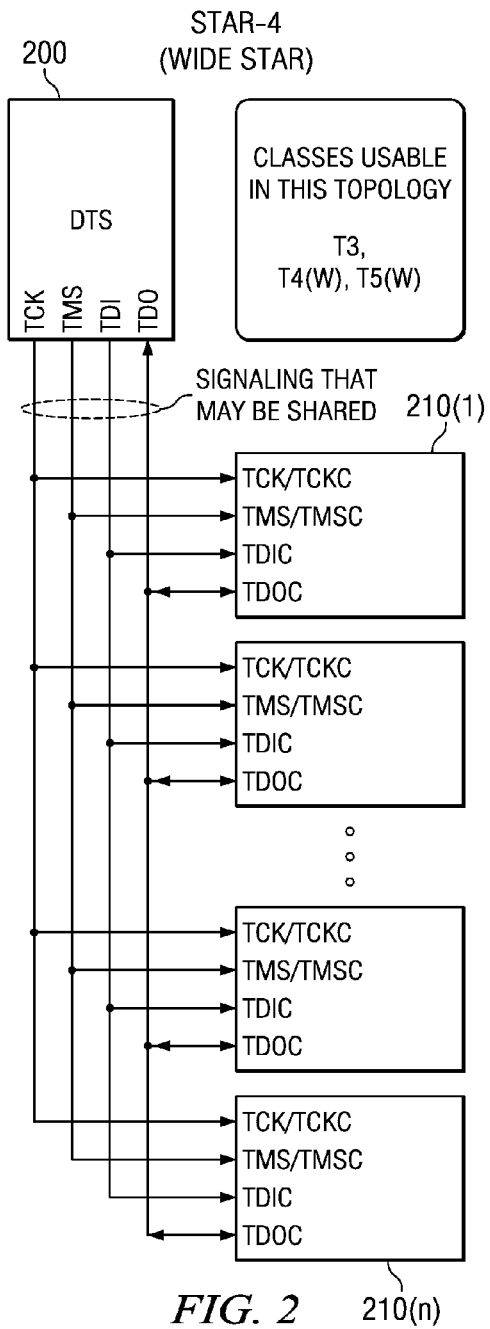
FIG. 1
FIG. 2

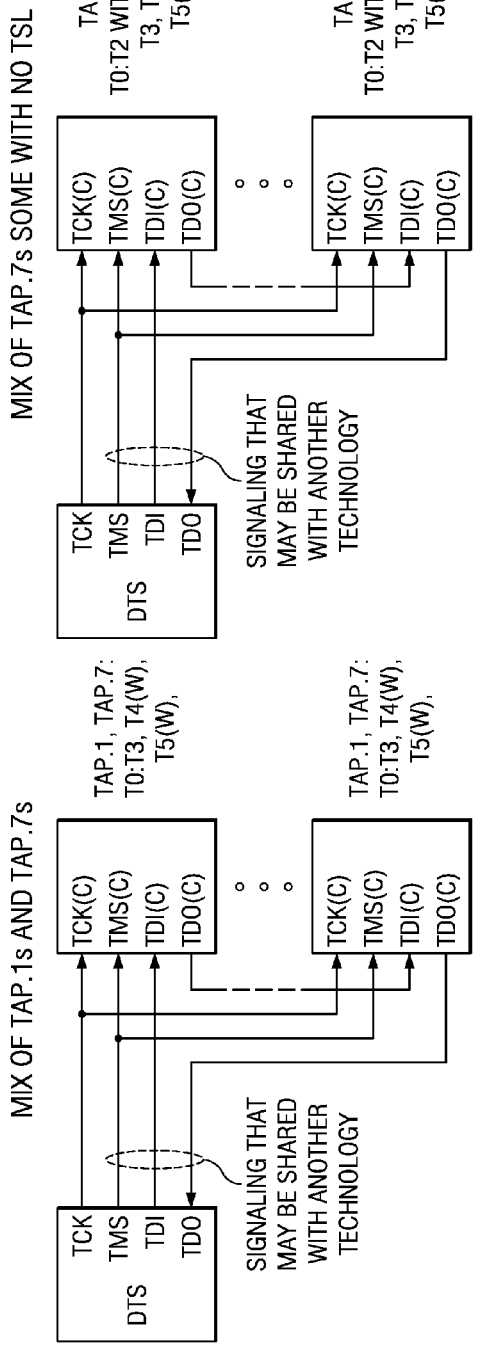
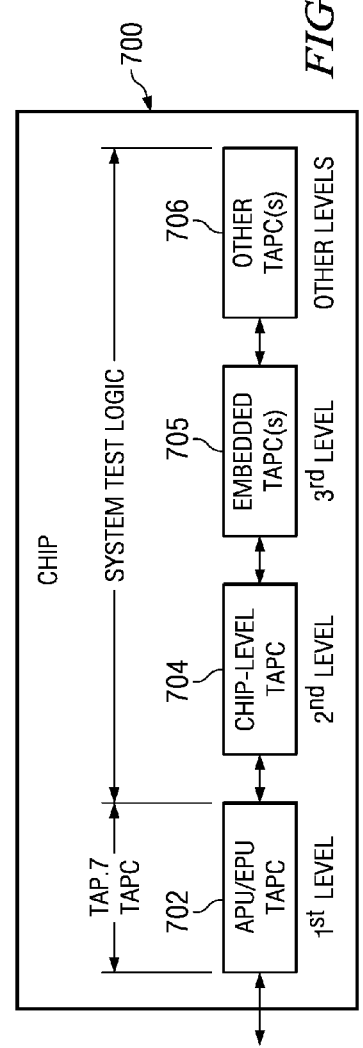
FIG. 6
FIG. 7

TCK/TMS(C) COUNTER CIRCUITRY WITH THIRD, FOURTH COUNT AND RESET OUTPUTS

CLAIM OF PRIORITY

This application is a divisional of prior application Ser. No. 14/803,645, filed Jul. 20, 2015, now U.S. Pat. No. 9,267,990, issued Feb. 23, 2016;

Which is a divisional of prior application Ser. No. 14/504,665, filed Oct. 2, 2014, now U.S. Pat. No. 9,116,207, granted Aug. 25, 2015;

Which is a divisional of prior application Ser. No. 13/964,574, filed Aug. 12, 2013, now U.S. Pat. No. 8,880,926, granted Nov. 4, 2014;

Which is a divisional of prior application Ser. No. 12/511,973, filed Jul. 29, 2009, now abandoned.

The present application claims priority to and incorporates by reference U.S. Provisional Application No. 61/084,474 filed Jul. 29, 2008, entitled "Topology Discovery Training."

And also claims priority to and incorporates by reference U.S. Provisional Application No. 61/084,471 filed Jul. 29, 2008, entitled "Series Equivalent Scans Across Multiple Scan Topologies."

And also claims priority to and incorporates by reference U.S. Provisional Application No. 61/084,463 filed Jul. 29, 2008, entitled "Selecting a Scan Topology."

And also claims priority to and incorporates by reference U.S. Provisional Application No. 61/084,458 filed Jul. 29, 2008, entitled "Automatic Scan Format Selection Based on Scan Topology Selection."

And also claims priority to and incorporates by reference U.S. Provisional Application No. 61/084,453 filed Jul. 29, 2008, entitled "Dynamic Broadcast of Configuration Loads Supporting Multiple Transfer Formats."

And also claims priority to and incorporates by reference U.S. Provisional Application No. 61/084,439 filed Jul. 29, 2008, entitled "Timing Protected Detection of Alternate Signaling Mechanism Using Clock and Data."

FIELD OF THE INVENTION

This invention generally relates to the field of testing integrated circuits and systems containing integrated circuits.

BACKGROUND OF THE INVENTION

The IEEE 1149.1 standard was adopted in 1990. Built upon the work of the Joint Test Action Group (JTAG), it provided a pins-out view from one IC pad to another to help test engineers locate and discover faulty PC boards. A description of the boundary scan description language was added in 1994.

Complications arose as chips increased functionality and designs shifted away from PC boards to multichip modules and stacked die packages. These difficulties included handling the pin count requirements and multiple Test Access Port (TAP) controllers for System-on-Chip (SoC) devices, testing multichip modules and stacked die configurations, enhancing debug performance, and improving test and debug logic power-down in low-power conditions.

Organizations like the Mobile Industry Processor Interface Alliance and the NEXUS 5001 Forum took up the challenge to solve the problems specific to their industries.

BRIEF DESCRIPTION OF THE DRAWINGS

Particular embodiments in accordance with the invention will now be described, by way of example only, and with reference to the accompanying drawings:

FIG. 1 is a block diagram illustrating a target system with series scan topology;

FIG. 2 is a block diagram illustrating a target system with four-wire star scan topology;

FIG. 6 is a series topology with mix of TAP.7s plus TAP.1s or TAP.7s with no TSL;

FIG. 7 is a block diagram illustrating TAP.7 TAPC hierarchy;

DETAILED DESCRIPTION OF EMBODIMENTS OF THE INVENTION

Figure 3:
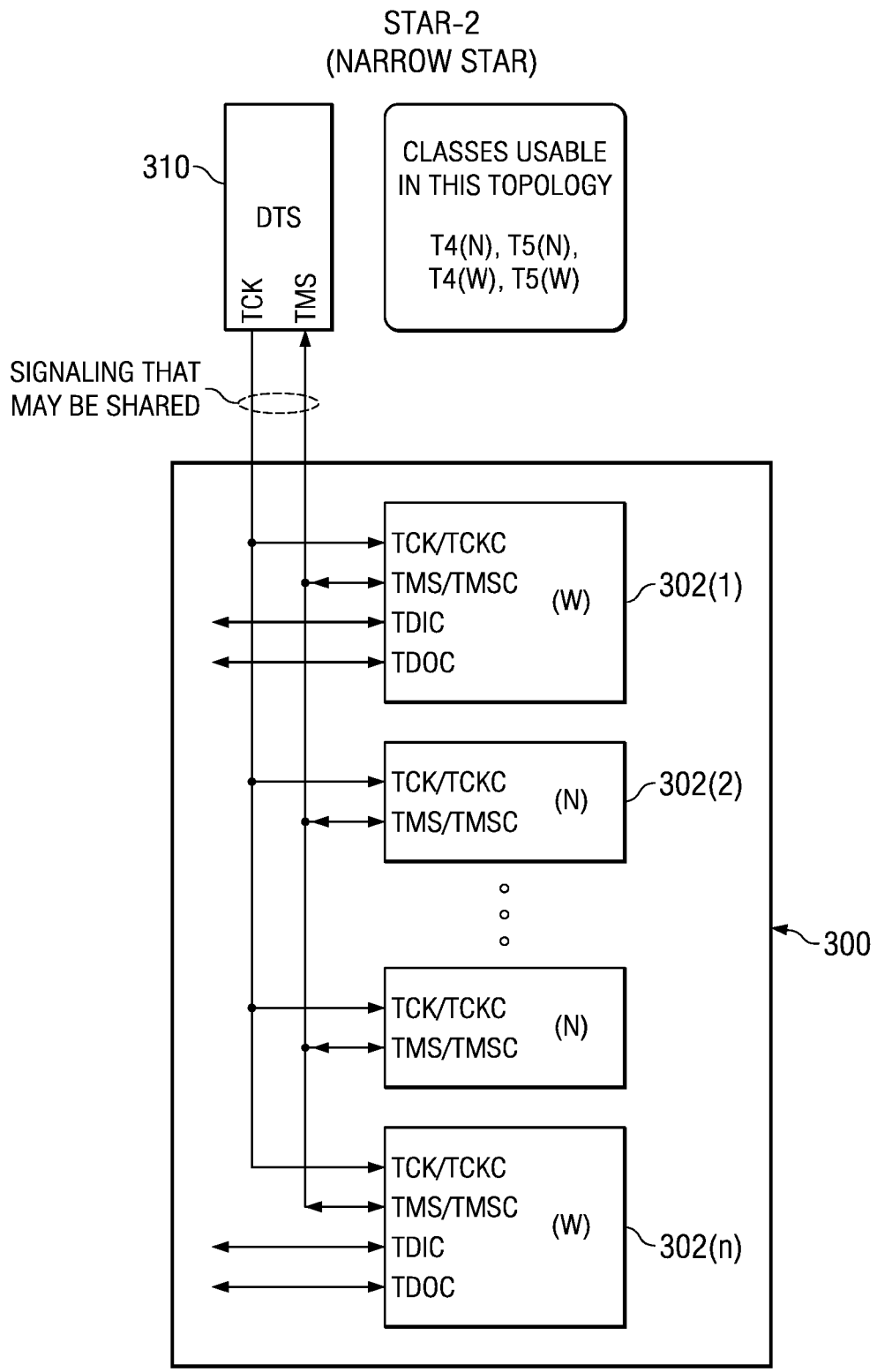
FIG. 3 is a block diagram illustrating a target system with two-wire star scan topology.

As chips add new functionality and system designs evolve away from boards and toward multi-chip system-on-chip (SoC) architectures, developers of handheld and consumer electronics are faced with stricter pin and package constraints. The IEEE 1149.7 standard is a new two-pin test and debug interface standard that supports half the number of pins of the IEEE 1149.1 technology, allowing developers to easily test and debug products with complex digital circuitry, multiple CPUs and applications software in products such as mobile and handheld communication devices.

Systems and integrated circuits that utilize IEEE 1149.7 may be designed to include a complex scan topology. Circuits and methods for determining control events signaled on the clock and data line of a two-wire or four-wire interface will be described in more detail below.

The IEEE 1149.7 is a complementary superset of the widely adopted IEEE 1149.1 (JTAG) standard that has been in use for more than two decades. This standard defines a port into embedded systems for device manufacturing, testing and software development during system development. In addition to maintaining compatibility with IEEE 1149.1, the new standard improves debug capabilities and reduces SoC pin-count requirements. It also standardizes power-saving conditions, simplifies manufacturing of multi-chip modules and stacked die devices, and provides the ability to transport instrumentation data. Concepts and terminology used in IEEE 1149.1 and in IEEE 1149.7 are used in a similar manner herein and are therefore not described in detail herein.

Rather than replacing IEEE 1149.1, the new IEEE 1149.7 standard expands its functionality while reducing the number of pins used in some configurations. It supports new scan topologies that are favorable to stacked die and multichip module configurations and offers advanced capabilities to aid in software debug. It describes circuitry that may be added to an integrated circuit to provide access to on-chip IEEE standard test access ports (TAPs) specified by IEEE Std 1149.1-2001. It provides complete backward compatibility with the 1149.1 standard while aggressively adding features to supporting applications test and debug. The circuitry uses IEEE Standard 1149.1-2001 as its foundation.

The 1149.7 Standard delivers these capabilities with six classes of test access ports (T0-T5), with each class providing incremental capability. The IEEE 1149.7 standard has two groups of capabilities: Classes T0 through T3, which extend IEEE 1149.1 and enable new operations using the IEEE 1149.1 protocol, and Classes T4 and T5, which are focused on advanced two-pin operation using an Advanced Protocol.

Class T0 ensures compliance with the industry's test infrastructure by setting up IEEE 1149.7 devices to make them act compatibly with IEEE 1149.1. These techniques include the use of N-bit IR, 1-bit DR for bypass instruction, mandatory IDCODE (32-bit path), and mandatory instructions behaving as specified in the IEEE 1149.1 specification. After a test logic reset is initiated, all multi-TAP devices must conform to the mandatory IEEE 1149.1 instruction behavior and implement a 1-bit DR scan for the bypass instruction. FIG. 1 illustrates such a system. Debug test system (DTS) 100 is generally a computer based system that provides control and a user interface for testing an integrated chip, printed circuit board or SoC using IEEE 1149.1 that has been enhanced to support the IEEE 1149.7 protocols. DTS 100 may be an XDS emulator from Texas Instruments, for example. Modules 110(1)-110(n) are representative of various modules that may be interconnected to DTS 100 using various aspects that will be described in more detail below.

Class T1 instantiates a control system for the IEEE 1149.7 standard that is transparent to IEEE 1149.1 devices, providing a foundation for the advanced functionality implemented in Classes T1 through T5 without changing the IEEE 1149.1 state machine. It supports standardized test and functional resets along with power management of the TAP controller and test logic.

Class T2 offers a chip-level bypass mechanism that shortens scan paths and another mechanism that provides hot connect capability to achieve higher performance for testing high chip count applications.

Class T3 provides for boundary scan testing using a four signal star topology (Star-4), with TAP selection built into the TAP.7 controller, unlike the use of a Star-4 Scan Topology described by the IEEE 1149.1 Standard. A T3 TAP may be deployed in either a series or star scan topology. A star topology is preferable for testing stacked die configurations. Whereas FIG. 1 shows the series scan topology, FIG. 2 illustrates the Star-4 or Wide Star configuration. In this case, modules 210(1)-210(n) are connected in a parallel manner using four wires and may be connected to DTS 200 that is configured to provide control over a star connected system, as will be described in more detail below. Direct addressability is included with T3 and above TAP.7 controllers.

Class T4 provides a reduction of number of test and debug pins in SoC devices, It supports scan transactions with two pins instead of four, resulting in fewer total pins required on chip packages. This also helps with stacked die configurations because it is highly desirable to have debug pins connected in parallel when dies are stacked. Two-pin operation is provided by eliminating the original data lines and sending bidirectional serialized data over the Test Mode Select (TMS) line, which is renamed TMS Counter (TMSC).

To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

To address the rising number of pins in SoC devices, Class T4 adds scan formats to support transactions with two pins instead of four, resulting in fewer total pins required on chip packages. This also helps with stacked die configurations because it is highly desirable to have the fewest number of connectors possible when die are stacked. The key to two-pin operation is eliminating the original data lines and sending bidirectional serialized data over the Test Mode Select (TMS) line, which is renamed TMS Counter (TMSC). To implement this capability, the glueless star configuration from Class T3 is utilized, this time without Test Data In (TDI) and Test Data Out (TDO). This is the Star-2 configuration shown in FIG. 3 in which an illustrative SoC 300 includes several die 302(1)-302(n) connected in a Star-2 arrangement using only two wires in a parallel manner. Of course, other embodiments may have fewer or more die and still use the two pin interconnection. Other embodiments may use the two pin interconnect for interconnection of packaged chips as well as bare or stacked die.

Besides reducing pin count, Class T4 defines optimized download-specific scan modes in which only useful information is downloaded. To improve pin operation performance, the clock rate also can be doubled. These features combined with the optimized transactions do not cause performance loss, instead improving performance in some cases.

Class T5 functionality is beneficial primarily to software designers utilizing a Test Access Port for debugging. This class gives the test port the ability to perform debug and instrumentation operations concurrently (data is transferred during idle time), which reduces the number of pins dedicated to instrumentation, and enables custom protocols to use the pins, a feature many vendors offer in nonstandard ways. Class T5 standardizes the process to access the pins. Class T5 provides both scan and data transport transactions using the two wire interface.

FIG. 3 also illustrates a debug test system (DTS) 310 coupled to SoC 300. DTS 310 is generally a computer based system that provides control and a user interface for testing an integrated chip, printed circuit board or SoC using IEEE 1147.1 that has been enhanced to support the IEEE 1147 protocols and two-wire interface, as will be described in more detail below. DTS 310 may be an XDS emulator from Texas Instruments, for example.

T0-T3, and T4/T5 four pin TAP.7s may be deployed in a Series Scan topology. T3 and T4/T5 four pin TAP.7s may be deployed in a Star-4 Scan topology. T4-T5 TAP.7s may be deployed in a Star-2 Scan Topology. When deployed in these scan topologies, all classes can traverse the state diagram using a common protocol (Standard—the legacy IEEE 1149.1 protocol). In the Series Scan Topologies data transfers to conventional 1149.1 instruction and data registers are performed with the Standard Protocol. In the Star-4 scan topology data transfers are performed with the Standard Protocol modified to prevent drive conflicts, with the ability to select the scan paths of only one TAP.7 controller in the topology at a time. This provides for sequential access to the paths of each TAP.7 controller in the branch. In the Star-2 scan topology, data transfers are performed only with the Advanced Protocol. The selection mechanisms for scan paths and TAPCs available with Star-4 operation are also available with Star-2 operation. Classes T0-T2 allow the use only the Standard Protocol, Class T3 allows the use of the Standard Protocol to traverse the TAPC state diagram and a modified Standard Protocol to either traverse the state diagram or perform data transfers in the Shift-IR and Shift-DR states. Classes T4 and T5 allow the use of the Standard Protocol to traverse the TAPC state diagram, a modified Standard Protocol to either traverse the state diagram or perform data transfers in the Shift-IR and Shift-DR states, when operated in a Star-4 Scan Topology, and Advanced Protocols to either traverse the state diagram or perform data transfers in the Shift-IR and Shift-DR states when operated in a Star-2 Scan Topology. It is important to note that with deployment in Star-4 and Star-2 topologies, TAP.7 controllers perform data transfers in these scan topologies using protocols unique to the topology in which they are deployed.

The operation of each of these Scan Topology Branches supports the selection of individual TAPCs and the scan paths associated with them during their independent operation. This is covered in the 1149.7 standard and not in this description.

TAP.7 architecture provides for the operation of Series, Star-4, and Star-2, Scan Topologies and other technologies sharing the TCK(C), TMS(C), TDI(C), and TDO(C) connections to a Debug Test System directing scan activity. These Scan Topologies are called branches of the system scan topology. With this architecture, an Adapter Test Access Port Controller (ADTAPC) is the gateway to scan facilities of a chip implementing an 1149.7 Test Access Port. The ADTAPC controls access to a Chip-Level Test Access Port Controller (CLTAPC) that provides access to chip-level scan paths Since a typical boundary scan operation requires scanning the instruction registers and boundary scan cells of one or more devices between the Select-xR and Update-xR states, a method is needed to duplicate the scan transaction available with a Series Scan topology when more than one scan topology is involved. With this description, states such as the Capture-xR and Update-xR TAP are to be interpreted as follows: the "x" refers to either "D" for data or "I" for instruction. Embodiments of the invention may provide this equivalent function, a series equivalent scan.

Series equivalent scans of a complex scan topology, i.e., a scan topology with two or more branches in which at least two of the branches are of differing technologies (see Table 1), sharing the same control and data signaling create the equivalent of an 1149.1 series scan that begins with the Select-xR state and ends with the Update-xR state. With a series Scan Topology, all scan paths of interest are scanned at the same time between these states. With a complex scan topology, this is not possible as methods used to transfer data to and from scan paths presented by Series, Star-2, and Star-4 Scan Topologies and other technologies is different.

With series equivalent scans, a scan is broken into sections consisting of one or more scan sections. With an 1149.7 Test Access Port, the scan section is one or more sequences of the Exit2-xR, one or more Shift-xR states, Exit1-xR, and one or more Pause-xR states). With another technology, scan data would be delivered as defined by the technology. These scan sections are sandwiched between a preamble (Select-xR, Capture-xR, Exit1-xR, and one or more Pause-DR states) and a postamble (Exit2-xR and Update-DR states). A single branch is selected between the preamble and the first scan section and between scan sections. All branches are selected between the last scan section and the postamble. With the sequence described above, all or some CLTAPCs in all branches progress from either the Test-Logic-Reset or Pause-xR state to the Pause-xR state without encountering an Shift-xR state. The TAPCs of all branches of interest operate in lockstep during the preamble and postamble state sequences, with only the TAPCs within branches that are selected during scan sections.

TABLE 1

Protocol usage by Technology

| TAPC State | Protocol | Topology Selected | Operation of Branches | | | |
|---|---|---|---|---|---|---|
| | | | Series | Star-4 | Star-2 | Other |
| Select-xR | Standard | All | Active | Active | Active | Active |
| Capture-xR | Standard | All | Active | Active | Active | Active |
| Exit1-xR | Standard | All | Active | Active | Active | Active |
| Pause-xR | Standard | All | Active | Active | Active | Active |
| — | — | — | Select-Series. | | | |
| Pause-xR | Standard | Series | Active | Dormant | Dormant | Dormant |
| Exit2-xR | Standard | Series | Active | Dormant | Dormant | Dormant |
| Shift-xR | Standard | Series | Active | Dormant | Dormant | Dormant |
| Shift-xR | Standard | Series | Active | Dormant | Dormant | Dormant |
| Exit1-xR | Standard | Series | Active | Dormant | Dormant | Dormant |
| Pause-xR | Standard | Series | Active | Dormant | Dormant | Dormant |
| — | — | — | Select-Star-2 | | | |
| Pause-xR | Advanced | Star-2 | Dormant | Dormant | Active | Dormant |
| Exit2-xR | Advanced | Star-2 | Dormant | Dormant | Active | Dormant |
| Shift-xR | Advanced | Star-2 | Dormant | Dormant | Active | Dormant |
| Shift-xR | Advanced | Star-2 | Dormant | Dormant | Active | Dormant |
| Exit1-xR | Advanced | Star-2 | Dormant | Dormant | Active | Dormant |
| Pause-xR | Advanced | Star-2 | Dormant | Dormant | Active | Dormant |

TABLE 1-continued

Protocol usage by Technology

| TAPC State | Protocol | Topology Selected | Operation of Branches | | | |
|---|---|---|---|---|---|---|
| | | | Series | Star-4 | Star-2 | Other |
| — | — | — | Select-Star-4 | | | |
| Pause-xR | Modified Std | Star-4 | Dormant | Active | Dormant | Dormant |
| Exit2-xR | Modified Std | Star-4 | Dormant | Active | Dormant | Dormant |
| Shift-xR | Modified Std | Star-4 | Dormant | Active | Dormant | Dormant |
| Shift-xR | Modified Std | Star-4 | Dormant | Active | Dormant | Dormant |
| Exit1-xR | Modified Std | Star-4 | Dormant | Active | Dormant | Dormant |
| Pause-xR | Modified Std | Star-4 | Dormant | Active | Dormant | Dormant |
| — | — | — | Select - Other | | | |
| Pause-xR | Tech. Defined | Other | Dormant | Dormant | Dormant | Active |
| Exit2-xR | Tech. Defined | Other | Dormant | Dormant | Dormant | Active |
| Shift-xR | Tech. Defined | Other | Dormant | Dormant | Dormant | Active |
| Shift-xR | Tech. Defined | Other | Dormant | Dormant | Dormant | Active |
| Exit1-xR | Tech. Defined | Other | Dormant | Dormant | Dormant | Active |
| Pause-xR | Tech. Defined | Other | Dormant | Dormant | Dormant | Active |
| — | — | — | Select-All | | | |
| Pause-xR | Standard | All | Active | Active | Active | Active |
| Exit2-xR | Standard | All | Active | Active | Active | Active |
| Update-xR | Standard | All | Active | Active | Active | Active |

Table 1 lists various protocols that may be used with a Series Equivalent Scan. A protocol understood by the TAPCs of a selected branch is used to drive the state progression of a scan section. It is not necessary that the TAPCs forming a deselected branch understand the protocol used during this state progression. Scan operations are performed on the selected branch while the other branches remain dormant. Branches that are not selected remain dormant and ignore the protocol being used until they are selected. Once all branches are selected following the last scan section, the TAP controllers forming all branches move through the Update-xR and Capture-xR states in lock step. This provides the function of a series scan.

In summary, a scan of the paths with a branch move the state of the TAPCs forming the branch to Pause-xR, sequentially selecting and scanning the scan paths of interest within each branch beginning and ending the scans in the Pause-xR state. Once these scans are complete, the update/capture operation is performed simultaneously in all TAPCs of all branches of interest The TAPC state may be moved from the Update-xR state to either the Run-Test/Idle state or Select-DR state on to the Pause-xR state where the sequential scans can again be performed. This process preserves the timing between the Update-xR and Capture-DR states when portion of the operation that does not include the Shift-xR state is performed using the Standard Protocol.

The Run-Test-Idle state may also be used to select branches. This capability can be used to select a branch and park the state of one or more of the TAPCs forming the branch. This may be sequentially done for all branches. Only those TAPCs within a branch that are not parked may leave the Run-Test-Idle state. When all branches are selected and the TAPC state moved to the Pause-DR state via the Select-DR state. The TAPCs whose state is parked in Run-Test-Idle state do not participate in the scans.

A Selection Escape Sequence is used to initiate a selection sequence. This sequence can select all ADTAPCs within a branch while deselection all ADTAPCs within other branches or select all ADTAPCs within all branches. A deselection escape sequence deselects all ADTAPCs of all branches. Although selection and deselection escapes can be associated with any ADTAPC state, they are expected to be used while in the Pause-xR and Run-Test-Idle states. This process will be described in more detail below.

DTS/TS Connectivity

The TAP.7 architecture supports both simple and complex system connectivity with a graduated set of capability. A system may deploy any mix of TAP.1s, TAP.7s, and potentially other legacy technologies as shown in FIG. 4, which is a block diagram of a target system with mixed use of technologies and scan topologies.

Most systems will implement only one branch of the connectivity shown in this figure. In most cases, the target system (TS) will only have a limited number of TAPs. Other architectures, represented by branches 406, 407, can also be included as additional branches that are separate from those shown in FIG. 4 in a custom scan topology. These branches are controlled in manner similar to TAP.7 branches.

Technology Branches

Figure 4:
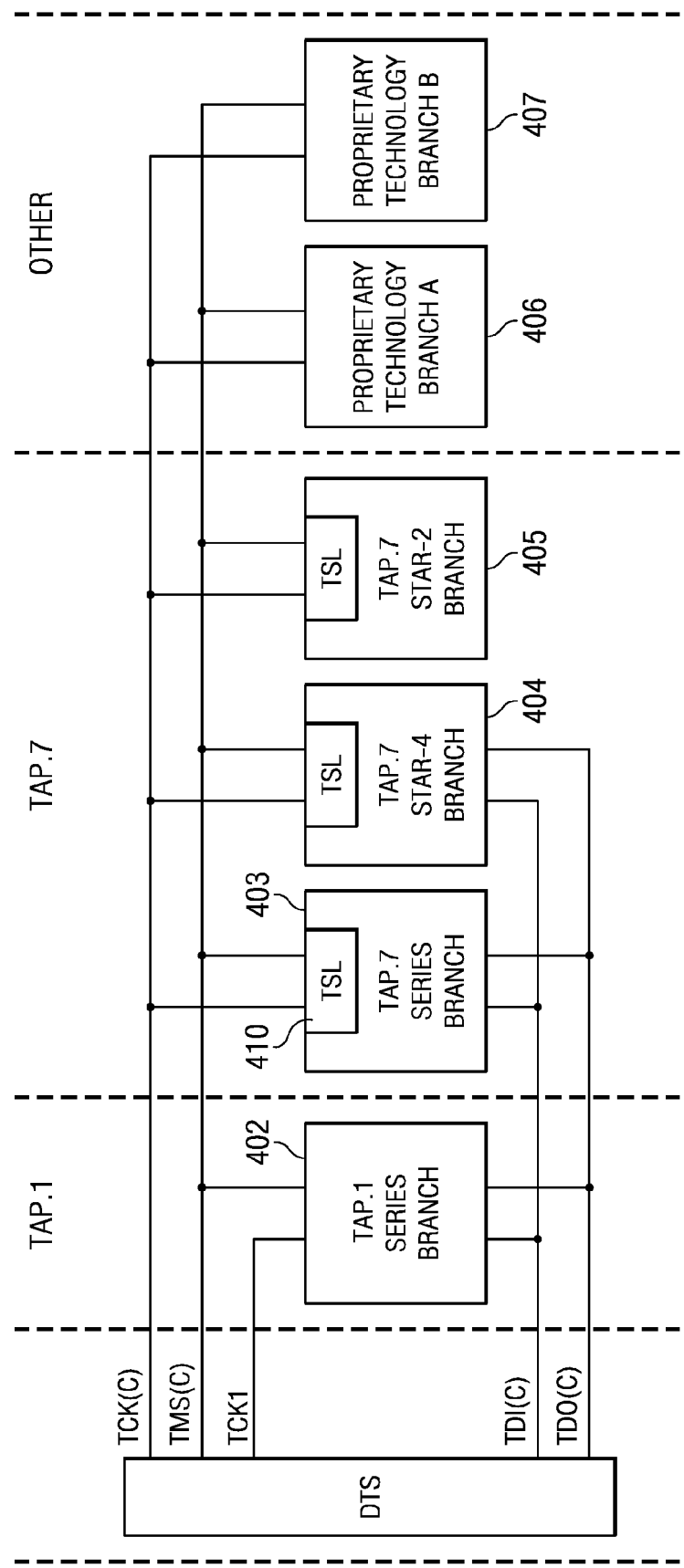
FIG. 4 is a block diagram of a target system with mixed use of technologies and scan topologies.

FIG. 4 is the union of simpler types of connectivity called technology branches. Each of the branches 402-407 shown in this figure may be operated separately for debug purposes. They may also be operated in a manner that provides Series Scan Equivalency across the branches controlled with the TCK1 and TCK(C) signals. Proprietary technologies are generally operated separately but may be operated with TAP.7 controllers in as shown in Table 1.

Other embodiments may have various combinations of branch operation. Other embodiments may use different sets of commands, protocols, events, etc. The list of protocols in Table 1 is not intended to be limiting to embodiments of the invention in any manner.

The TAP.7 branches 403-405 have one or more TAP.7s connected in Series, Star-4, and Star-2 Scan Topologies. These branches contain logic to select or deselect an ADTAPC, indicated generally at 410. This logic provides for the selection and deselection of these branches with Selection and Deselection Escape Sequences. ADTAPC selection logic is optional for T0-T2 TAP.7s and mandatory for T3 and above TAP.7s. Including this logic in T0-T2 TAP.7s supports their deployment in systems where T4(N) and T5(N) TAP.7s may be deployed.

The TAP.1 branch 402 includes a TAP.1 or a T0-T2 TAP.7 without technology selection logic connected in series with other TAP.1s or TAP.7s. It operates with the standard protocol and TAPs with the four 1149.1 signals. This branch is selected using the TCK1 signal shown in this figure as it has no built-in selection mechanism. T0-T2 TAP.7s without selection are included in a branch that is this type. The ADTAPC selection logic may be added to the current 1149.1 technology to make it selectable using common connectivity.

Proprietary technologies 406, 407 may be connected in parallel with the TAP.7 branches provided: the technology has a dedicated clock and at least one control/data input; the technology implements the technology selection mechanisms and protocols defined by the 1149.7 standard; and the clock pin of the technology is connected to the TCK(C) signal and the control/data pin is connected to the TMS(C) signal.

As noted previously, a TAP.1 branch is selected by keeping its TCK or TMS signal separated from the signal of like name of branches and gating one of the separate signals to deselect the branch. The gating of the TCK signal of this type of branch is used to select these types of branches. In some embodiments, TAP.1s and T0-T2 TAP.7s without the Technology Selection Logic (TSL) are selected using in this manner. In some embodiments, any branch may be selected in this manner if desired.

TAP.1s and TAP.7s can be deployed in topology branches as shown in Table 2. Each of these topologies is considered a technology within this document.

more than one TAPC per component the 1149.7 test view requires hierarchical scan description language (HSDL), plus BSDL for each endpoint.

TAP.7 Deployment Scenarios

Series branches may be constructed from TAP.1s and four pin TAP.7s as shown in FIG. 6. This scan topology may share the TMS, TDI, and TDO connectivity with another topology provided TCK(C) or TMS(C) signal is used to select/deselect this topology.

In most cases, one or more TAP.7s is connected in one of the Scan Topologies shown in FIGS. 1-3. Note that the convention for naming DTS TDI/TDIC and DTS TDO/TDO signals in FIGS. 1-3 is: 1) The DTS TDI/TDIC signal sources chip TDI information; 2) The DTS TDO/TDOC signal is the destination for chip TDO information.

The Star-2 Scan Topology illustrated in FIG. 3 is a subset of both the Series and Star-4 Scan Topologies. This means that the Series and Wide Star Scan Topologies may be operated as a Star-2 Scan Topology when every test access port sharing the connection is a T4 and above TAP.7.

Chip TAPC Hierarchy

A hierarchical view of TAPCs within a chip is needed to maintain IEEE 1149.1 compliance and provide solutions to the compatibility requirements identified earlier. For a given chip, three or more levels of TAPC hierarchy are accommodated as follows:

$1^{st}$ level—a TAPC within the TAP.7 controller—the primary interface to the DTS.

$2^{nd}$ level—a TAPC at the chip-level (CLTAPC).

$3^{rd}$ level—embedded TAPCs connected to the chip-level TAPC.

Other levels, if needed.

While all levels of the TAPC hierarchy need not be present in all chips, the TAP.7 architecture accommodates

TABLE 2

Branch/technology deployment permissibility

| Branch | Proprietary | TAP.1 | T0-T2 w/o TSL | T0-T2 w/TSL | T3 | T4(W) | T5(W) | T4(N) | T5(N) |
|---|---|---|---|---|---|---|---|---|---|
| TAP.1 Series | No | Yes | Yes | Yes | Yes | Yes | Yes | No | No |
| TAP.7 Series | No | No | No | Yes | Yes | Yes | Yes | No | No |
| TAP.7 Star-4 | No | No | No | No | Yes | Yes | Yes | No | No |
| TAP.7 Star-2 | No | No | No | No | No | Yes | Yes | Yes | Yes |
| Proprietary | Yes | No | No | No | No | No | No | No | No |

Chips, Components, and Boards

With the TAP.7 architecture, any part of this connectivity shown in FIG. 4 may be deployed on a board, within a package, or within a chip. This comprehends the packaging and integration trends since the inception of the 1149.1 Standard.

Figure 5:
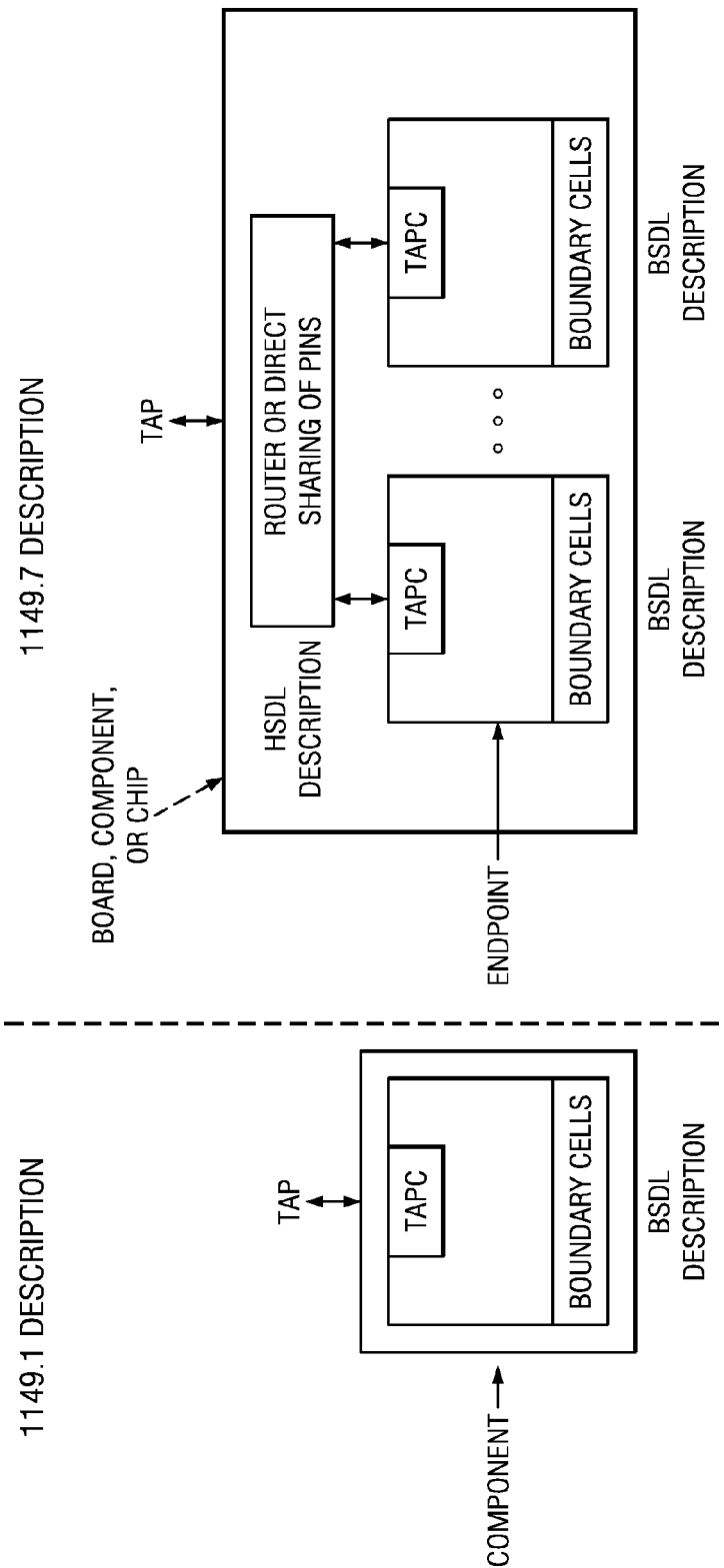
FIG. 5 is an illustration contrasting 1149.1 and 1149.7 test views.

The IEEE 1149.1 test view allows only one TAPC per component. The 1149.7 test view is a superset that allows multiple TAPCs per component. With the 1149.7 test view, a component: is either a package containing one or more chips, or a direct mount chip; provides access to one or more TAP.1 or TAP.7 controllers through the same or separate pins; and provides access to proprietary TAPCs or other technologies through the same or separate pins. This superset blurs the boundary between board, component, and chip. This blurring allows operation across those boundaries as shown in FIG. 5. When there is only one TAPC per component, the 1149.1 and 1149.7 test views are described by boundary scan description language (BSDL). When there is them when they occur. The TAPC hierarchy is shown in FIG. 7. Exemplary chip 700 includes TAPC 702 that is implemented as a T0 with control events or a TSL for T1 and above. Chip level TAPC (CLTAPC) 704 operates under Adapter TAPC (ADTAPC) 700. Embedded TAPC(s) (EMTAPCs) 705 operate under CLTAPC 704. Additional levels of EMTAPCs 706 may be embodied as needed. The EMTAPC(s) 705 and EMTAPC(s) 706 are hidden following a test reset.

A chip with IEEE 1149.7-compliant behavior always has a Chip-Level TAPC 702. It may also include one or more Embedded TAPCs 704, all of which are considered subordinate to the chip-level TAPC (CLTAPC). The CLTAPC is considered the parent of the Embedded TAPC(s). The addition of the Enhanced Protocol Unit (EPU) to a T1 or above TAP.7 controller adds the ADTAPC but does not add instruction or data registers in series or parallel with those associated with the CLTAPC and the EMTAPCs. The ADTAPC is considered the parent of the CLTAPC. The addition of the Advanced Protocol Unit (APU) in a T4 or T5 TAP.7 does not add an additional TAPC or level of TAP.7 TAPC hierarchy.

The ADTAPC 702 is connected to the CLTAPC 704. The CLTAPC may provide access to EMTAPCs. The EMTAPCs are hidden following a Test Reset to present the test view of a component specified by the 1149.1 Standard. The "other TAPCs" portion of the hierarchy can have additional levels of hierarchy. The TAPC hierarchy may vary dramatically by chip, with the TAPs accessed varying by application. In one or more embodiments of the invention, the DTS dynamically manages the TAPC hierarchy to: accommodate a Star Scan Topology, minimize the length of the scan path, and avoid non-functional parts of the hierarchy.

Combined View of TAP Connectivity and TAPC Hierarchy

Figure 8:
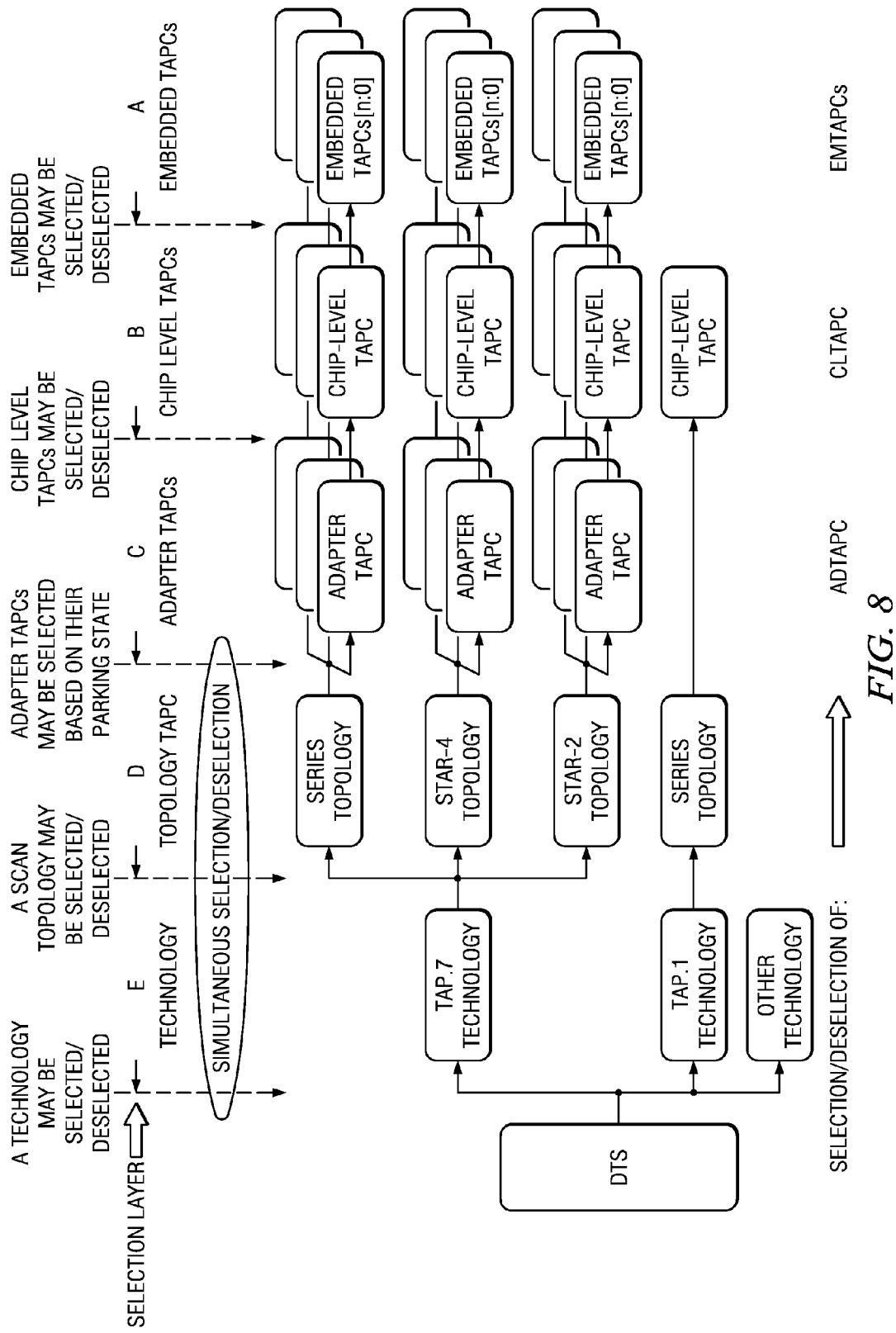
FIG. 8 is an illustrative block diagram of system connectivity supported by TAP.7 architecture.

The combination of the system shown in FIG. 4 and the TAP.7 TAP hierarchy shown in FIG. 7 creates the system connectivity and TAPC hierarchy shown in FIG. 8. The selection layers (labeled A-E) are shown this figure. The entities actually selected and deselected are shown at the bottom of this figure.

Selection Concepts

Additional selection concepts beyond those supported by the IEEE 1149.1 standard are provided to access to the CLTAPCs and EMTAPCs shown in FIG. 8. These concepts support the use of the selection hierarchy, the parking of CLTAPC and EMTAPC states and resynchronization of the CLTAPC and EMTAPC to the state of their parent, and common signaling across technologies.

Hierarchical Selection and Deselection TAPCs

These concepts provide the DTS the means to interact with all or a subset of the technology connected to it. They provide a means to select the various levels of the hierarchy shown in FIG. 8. Lower levels of the hierarchy become usable when all nodes above it are selected and become unusable when any node above it is deselected. Selection and deselection is provided at the following nodes in the hierarchy: specific technology, Series, Star-4, Star-2, or all TAP.7 Scan Topologies, an ADTAPC within a TAP.7 Scan Topology (depending on the ADTAPC state), a CLTAPC connected to an ADTAPC, and EMTAPCs connected to a CLTAPC.

A command sequence is provided to establish the scan topology in which a TAP.7 TAPC is deployed since the TAP.7 controller needs to know the scan topology in which it is deployed. Selection/deselection interoperability with proprietary, legacy, and TAP.7 technologies is provided through the use of a common set of signaling conventions for these functions. The DTS and TS exchange information in one of two ways: 1) A TCK(C) signal edge sampling the TMS(C) signal value; and 2) a count of TMS(C) signal edges while the TCK(C) signal is a logic 1. Both of these means may be used concurrently within the same TCK(C) bit period. The following signaling characteristics make this possible.

Control events to perform selection and de-selection are sent from the DTS to the scan topology via the TCK(C) and TMS(C) signal lines and received by the various TAPCs included within the topology. A TAP.7 TAPC interprets the count of the number of TMS(C) edges while TCK(C) is a logic 1 as one of four control events. Each control event has a different function and TMS(C) edge count. These control events, their edge count, and their function are described below and shown in FIGS. 9A-9D. Table 3 lists the four control events.

TABLE 3

Control Events signaled via TCK(C) and TMS(C)

| | |
|---|---|
| Custom (2 or 3 edges) | Performs a technology specific function. |
| Deselection (4 or 5 edges) | Initiates the deselection of an online technology. |
| Selection (6 or 7 edges) | Initiates the selection of a technology via a subsequent selection test |
| Reset (>7 edges) | Resets all technologies (generates a Type-3 TAP.7 TAPC reset) |

The DTS creates a control event by generating one or more TMS(C) edge pairs while the TCK(C) signal is a logic 1 value as shown in FIGS. 9A-9D. Even and odd TMS(C) edge counts beginning with two are given the same meaning. This accommodates the case where a change of state of the TMS(C) signal related to data occurs while the TCK(C) is a logic 1. This can occur because of propagation delays when a change in state of the TMS(C) signal is initiated by a falling edge of TCK(C) or by a change in state of the TMS(C) signal is initiated by a rising edge of TCK(C).

This approach allows the interoperability of technologies that change their data/control signal with the different edges of the clock. The relationship between the TAP.7 class and the deployment of control event detection is shown in Table 4.

TABLE 4

TAP.7 class/control event deployment relationships

| | Class | | | |
|---|---|---|---|---|
| Capability | T0-T1 | T2 | T3 | T4 and above |
| Control Event Detection | Optional | Optional | Mandatory | Mandatory |

The implementation of Control Event Detection becomes mandatory for T0-T3 TAP.7s when the optional TAP.7 Selection Logic is implemented with these TAP.7 classes. Their detection and use may be easily added as a wrapper to TAP.1 and many other technologies without changing the underlying technology in any way.

Since the TMS(C) signal is used as a clock with control events, care should be taken to minimize board-level transmission line effects to assure their proper operation.

In some embodiments, a control event is detected only when a reset is not asserted to the detection circuit. It begins and ends while the TCK(C) is a logic 1 and uses TMS(C) as a clock while the TCK(C) is a logic 1. In this manner, additional control information is overlaid onto the information that is normally transferred with the TCK(C) and TMS(C) without changing the information. Control events are detected when TCK(C) is a logic 1 regardless of the TCK(C) and TMS(C) drive histories.

Figure 9A:
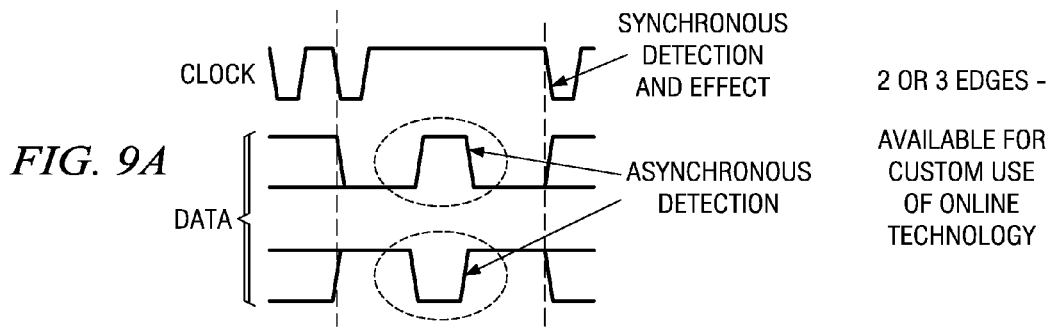
FIGS. 9A-9D illustrate signaling of commands using the TCK(C) and TMS(C) signal lines.
Figure 9B:
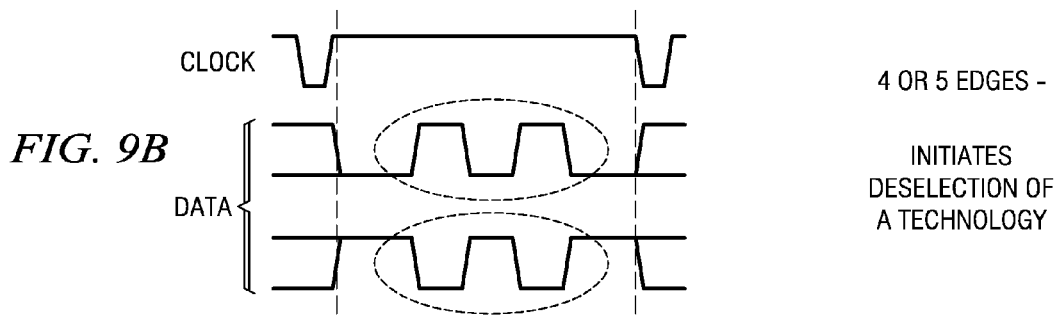
Figure 9C:
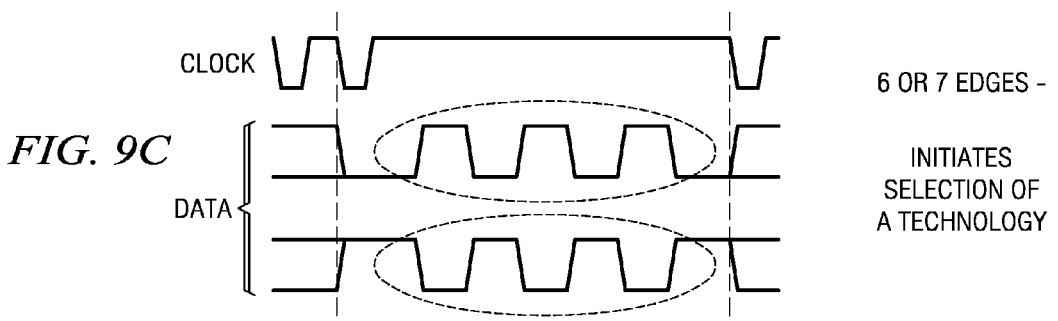
Figure 9D:
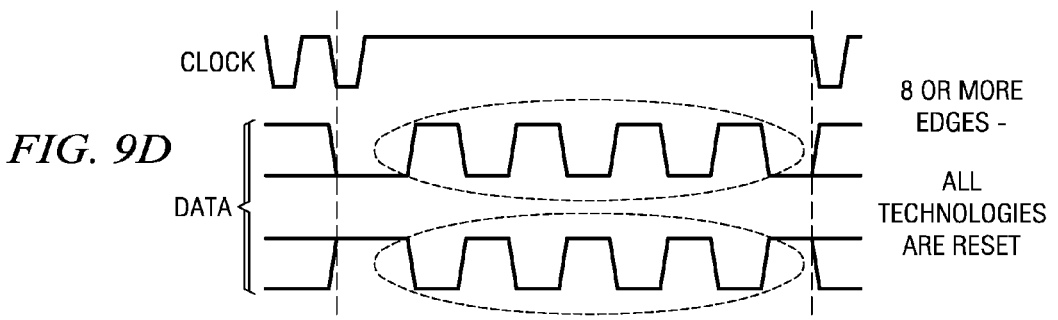

The detection of the four control events is shown in FIGS. 9A-9D. FIG. 9A illustrates a custom event. An online technology can use the custom event in any manner it chooses. It is not used with T0-T3 TAP.7s. It is used as an End of Transmission (EOT) event with T4 and above TAP.7s. FIG. 9B illustrates selection events while FIG. 9C illustrates deselection events. FIG. 9D illustrates a Reset Event. A reset event initializes all technologies sharing the TCK(C) and TMS(C) connectivity. A reset event resets the technology. It is recommended that this reset occur with the falling edge of TCKC other than inhibiting the drive of the TMS(C) pin. With a TAP.7 controller, it generates a Type-3 reset. This event generates a Type-3 reset beginning with falling edge of TCK(C) following the asynchronous detection of the event.

The TAP.7 controller logic may accommodate the possibility that the TMS(C) edge establishing the TMS(C) value for the bit period may occur after the TCKC signal is a logic 1. Changes in data values occur relative to the falling edge of the test clock but may appear at the TS inputs after the rising edge of the test clock as a result of analog delays in the system. This means the TAP.7 controller should interpret an odd number of edges occurring while TCK(C) is a logic one as the next lowest even number. This makes the TAP.7 controller's escape sequence detection logic insensitive to the timing relationship of the TCK(C) falling edge and a change in the TMS(C) value generated by the TCK(C) falling edge.

DTS Responsibilities

The DTS should assure the TMS(C) signal logic level at the beginning and end of the bit period coincident with a control event is the value required to convey the TMS(C) value for the bit period. The DTS should separate the first TMS(C) edge associated with a control event from the preceding TCK(C) falling edge and other TMS(C) edges associated with a control event by at least one minimum TCK(C) period, and separate the last TMS(C) edge associated with a control event and the subsequent TCK(C) falling edge by at least one minimum TCK(C) period. Timing considerations of interface power-down modes should be considered when setting the duration of the TCK(C) logic 1 time for control event generation.

In some embodiments, since the TCK(C) pin must be a logic 1 while TMS(C) is toggled, it is generally only practical to generate escape sequences when the DTS sources TCK(C). The n and n+1 nature of escape sequences accommodates designs where, at the highest TCK(C) frequency, there is a possibility that data transitions on the TMS(C) pin initiated by the falling edge of the TCK(C) may be delayed sufficiently (e.g., by a propagation delay) so as to occur following the rising edge of the TCK(C). In this case this edge is counted in addition to the even number of edges of TMS(C) creating an escape sequence, creating an odd TMS(C) edge count as described previously.

Figure 10A:
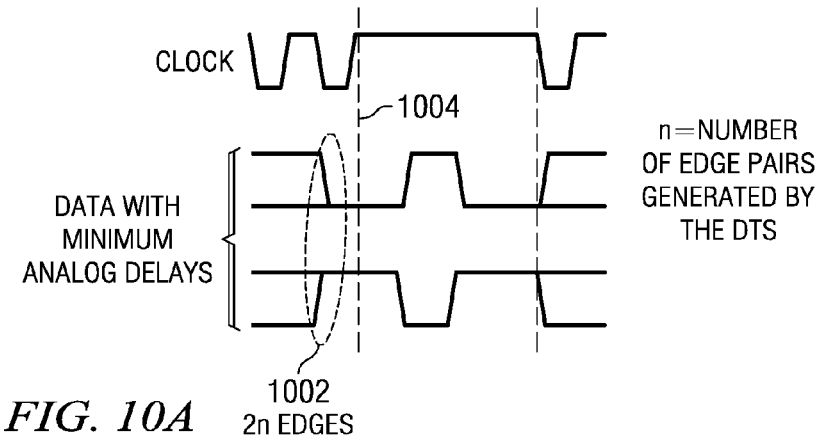
FIGS. 10A and 10B are timing diagrams illustrating variation in edge detection due to propagation delay.
Figure 10B:
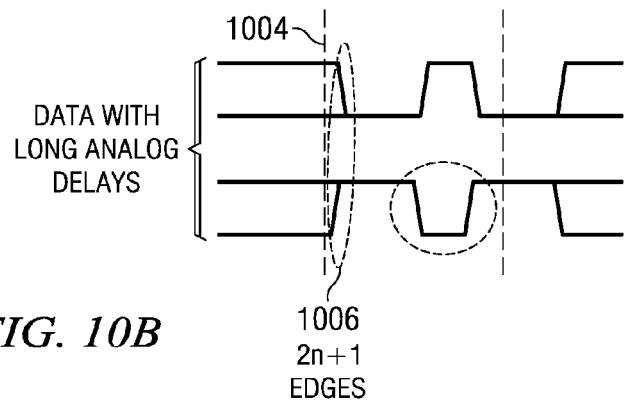

FIGS. 10A and 10B are timing diagrams illustrating variation in edge detection due to propagation delay. FIG. 10A illustrates the case where the transition of the last data edge 1002 on the TMS(C) line occurs prior to the clock signal being held high as indicated at 1004. FIG. 10B illustrates the case were the transition of the last data edge 1006 occurs after the clock signal being held high as indicated at 1004. In this case, the delayed transition may be included in the edge count. In order to avoid confusion, an extra edge is accommodated in the edge count analysis, as discussed above.

Example Circuit for Control Event Detection

Figure 11:
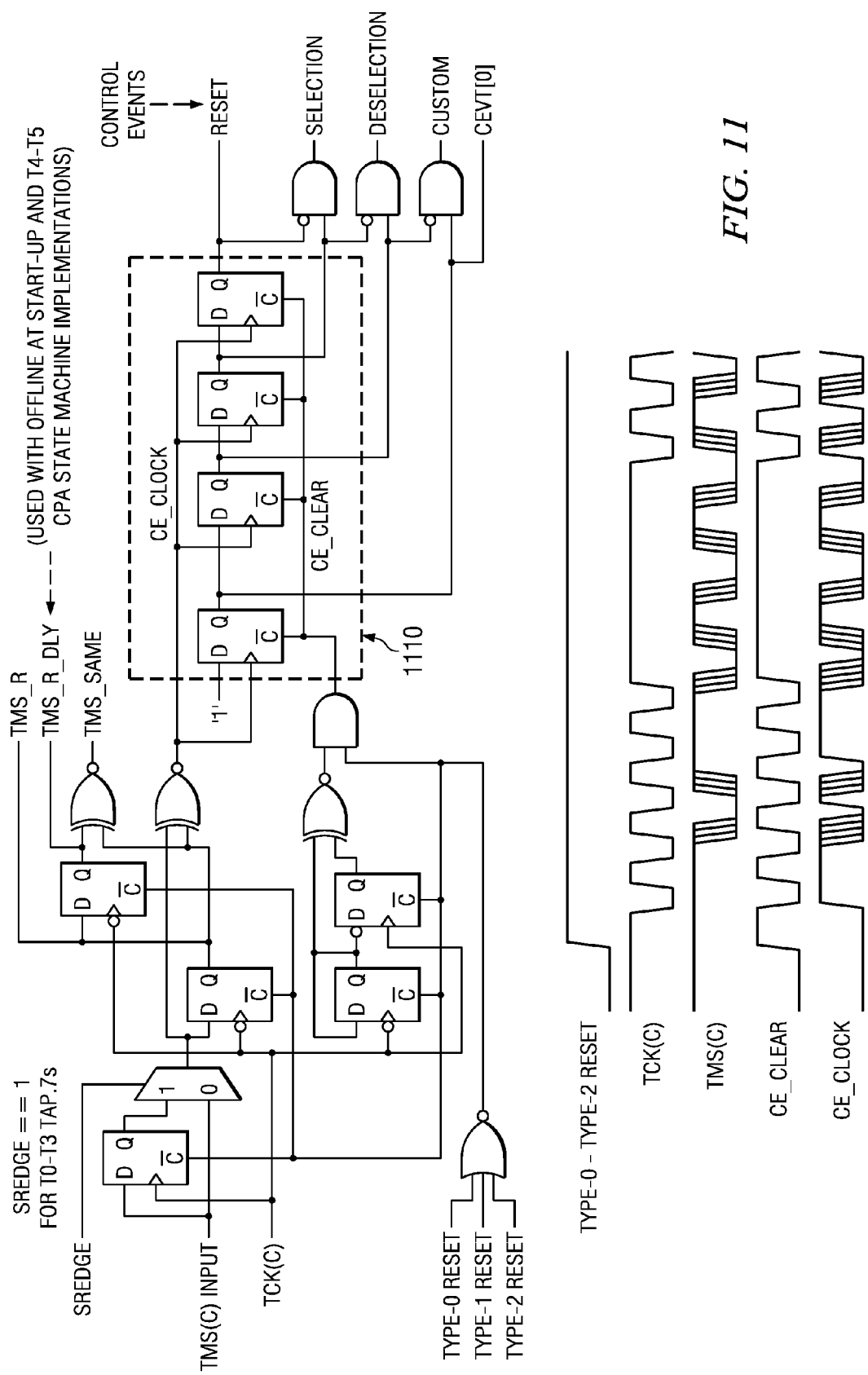
FIG. 11 is a conceptual schematic of the control event detection function.

An example of a circuit that may be used for event detection is shown in FIG. 11. This circuit is to be viewed as only an example of how event detection may be accomplished. Other methods of event detection may be used. The control event detection logic shown in this figure operates as follows: Certain TAP.7 controller resets (Type-0-Type2) initialize this logic; at start-up, the default TCK(C) signal value is a logic 1; the behavior of the TMS(C) signal is determined by the TAP.7 controller start-up option; CE_CLEAR is asserted by a falling edge of TCK(C) and released by a rising edge of TCK(C); it is released by Type-0, Type-1, and Type-0 resets when these resets initialize this function.

After CE_CLEAR is deasserted, a rising edge of CE_CLOCK causes the counter to increment thermometer code counter 1110. The CE_CLOCK is created with the XNOR of the TMS(C) signal and the last value TMS(C) value sampled with the falling edge of TCK(C). This assures the first edge created by a normal change in TMSC data creates a falling edge of the CE_CLOCK signal. This edge is therefore discarded by the thermometer code counter 1110 that counts TMS(C) edges when it occurs after CE_CLEAR is released. When an even number of edges is created, there will be n CE_CLOCK rising edges and n falling edges. When an odd number of edges is created, there will be n CE_CLOCK rising edges and n+1 falling edges. The control events are decoded from the thermometer code counter value as shown in FIG. 11. The decoded control events are used as inputs of the logic trees of flip-flops clocked by the falling edge of TCK(C). The Reset Event is also used to inhibit the drive of the TMS(C) pin with a T4-T5 TAP.7 controller.

Control events are detected in this manner by a T0-T2 TAP.7 implementing a Reset and Selection Unit and a T3-T5 TAP.7. The use of the term "minimum period of TCK(C)" means the TCK(C) period when the TAP.7 is operated at its maximum specified frequency. A control event should be detected and its associated function performed provided all the following timing constraints are met: 1) the first TMS(C) edge associated with a control event follows the rising edge of TCK(C) by a minimum TCK(C) period; 2) TMS(C) edges follows the first TMS(C) edge associated with a control event by at least one minimum TCK(C) period; and 3) TCK(C) falling edge follows the last TMS(C) edge associated with a control event by at least one minimum TCK(C) period.

The count of the TMS(C) signaling edges begins at zero immediately after any of the following: Type-0 reset, Type-1 reset, Type-2 reset, or a TCK(C) signal value of logic 0. The count of the TMS(C) signaling edges related to control event detection is incremented when all of the following are true: Type-0 reset is inactive, Type-1 reset is inactive, Type-2 reset is inactive, the TCK(C) value is a logic 1, and either of the following are true: the TMS(C) signal switches from a logic 1 to a logic 0 or the TMS(C) signal switches from a logic 0 to a logic 1.

In some embodiments, a TAP.7 controller detects a control event independent of the TMS(C) pin drive history while TCK(C) is a logic 1.

Figure 12:
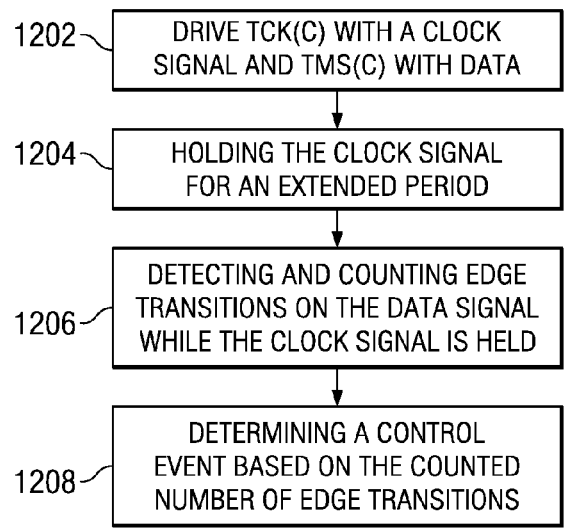
FIG. 12 is a flow diagram event signaling in a target system.

FIG. 12 is a flow diagram illustrating a method for signaling control events to a target system having a plurality of components coupled to a scan path. In normal operation, the TCK(C) signal line carries 1202 the clock signal and the TMS(C) signal line carries 1202 the mode data in a four wire interface or the mode and scan data in a two wire interface. The data is generally synchronized to the clock signal. When a control event is to be transferred to the target system, the clock signal is held high 1204 for an extended period of time. While the clock signal is held high, the data signal is transitioned a number of times to indicate the desired control event. The target system detects 1206 this condition, and counts the number of edge transitions that occur while the clock signal is held high. Once the clock signal is released and resumes normal operation, the target system can determine the control event based on the number of edges counted, as listed in Table 2.

Other Embodiments

While the invention has been described with reference to illustrative embodiments, this description is not intended to be construed in a limiting sense. Various other embodiments of the invention will be apparent to persons skilled in the art upon reference to this description. For example, edge transitions on the data signal may be counted while the clock signal is held at a low logic level. In another embodiment, more than four events may be signaled by defining a larger number of edge counts. For example, detection of ten or eleven edges may imply a fifth type of control event, detection of twelve or thirteen edges may imply a sixth type of control event, etc.

In another embodiment, more than two edges may be used for each control event. For example, 2-5 edges may represent a first event, 6-11 edges may represent a second event, 12-19 edges may represent a third event, etc.

In another embodiment, a device other than a TAP may be configured to receive data on a data signal synchronized to a clock signal in one mode of operation and to detect an event when the data signal is toggled for a range of counts while the clock signal is held at either a high or a low logic level in a second mode of operation.

In another embodiment, two or more data signals may be toggled to convey two or more events simultaneously.

In another embodiment, the data signal may be toggled during a normal period of the clock signal, rather than holding the clock signal for an extended period.

Although the embodiments of the invention find particular application to systems using Digital Signal Processors (DSPs), implemented, for example, in an Application Specific Integrated Circuit (ASIC), other embodiment may find application to other types of systems, which may have another type of processors. Another embodiment may also be a system that does not include a processor. An ASIC that embodies the invention may contain one or more megacells which each include custom designed functional circuits combined with pre-designed functional circuits provided by a design library, wherein some or all of the megacells include a test access port.

An embodiment of the invention may be a substrate to which is attached multiple chips that have individual test access ports, commonly referred to as multi-chip modules. An embodiment may include stacked die devices that have individual test access ports. Another embodiment may be a substrate, such as a printed circuit board, to which is attached multiple chips that have individual test access ports.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

It is therefore contemplated that the appended claims will cover any such modifications of the embodiments as fall within the true scope and spirit of the invention.

What is claimed is:

1. An integrated circuit comprising:
    (a) a test clock lead capable of receiving a test clock signal;
    (b) a test mode select counter lead capable of carrying bidirectional serial data signals and receiving a test mode select signal;
    (c) first circuitry having inputs coupled to the test clock lead and to the test mode select counter lead, and having a CE clock output lead for carrying CE clock signals;
    (d) counter circuitry having a CE clock input connected to the CE clock output lead, the counter circuitry counting edges of the CE clock signals, a first count output corresponding to a first count of the CE clock signals, a second count output corresponding to a second count of the CE clock signals, a third count output corresponding to a third count of the CE clock signals, a fourth count output corresponding to a fourth count of the CE clock signals, the counter circuitry having a reset output coupled to the fourth count output; and
    (e) gating circuitry having inputs connected to the first and second count outputs and having a technology specific function output lead carrying an output based on the first and second count outputs.

2. The integrated circuit of claim 1 including adapter test access port circuitry that includes the test clock lead, the test mode select counter lead, the first circuitry, the counter circuitry, and the gating circuitry.

3. The integrated circuit of claim 1 including adapter test access port circuitry that includes the test clock lead, the test mode select counter lead, the first circuitry, the counter circuitry, and the gating circuitry, and including chip level test access port circuitry coupled to the adapter test access port circuitry.

* * * * *